(12) United States Patent
Ishii et al.

(10) Patent No.: US 9,380,237 B2
(45) Date of Patent: Jun. 28, 2016

(54) SEMICONDUCTOR INTEGRATED CIRCUIT, CURRENT CONTROL METHOD, AD CONVERTER, SOLID-STATE IMAGING DEVICE, AND ELECTRONIC SYSTEM

(71) Applicant: Sony Corporation, Tokyo (JP)

(72) Inventors: Hiroyasu Ishii, Kanagawa (JP); Tomohiro Takahashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 27 days.

(21) Appl. No.: 14/051,660

(22) Filed: Oct. 11, 2013

(65) Prior Publication Data

US 2014/0132814 A1 May 15, 2014

(30) Foreign Application Priority Data

Nov. 12, 2012 (JP) .................................. 2012-248392

(51) Int. Cl.
*H04N 5/369* (2011.01)
*G05F 3/26* (2006.01)
*H03M 1/06* (2006.01)
*H03M 1/74* (2006.01)

(52) U.S. Cl.
CPC .............. *H04N 5/3698* (2013.01); *G05F 3/262* (2013.01); *H03M 1/0604* (2013.01); *H03M 1/742* (2013.01)

(58) Field of Classification Search
CPC . H04N 5/37455; H04N 5/3698; H04N 5/374; H04N 5/378; H04N 17/002; G05F 3/02; G05F 3/262; H03M 1/0604; H03M 1/34; H03M 1/742
USPC ........................................................ 348/308
See application file for complete search history.

(56) References Cited

U.S. PATENT DOCUMENTS

| | | | | |
|---|---|---|---|---|
| 6,577,185 B1 * | 6/2003 | Chandler | .............. | H03F 1/0277 330/133 |
| 6,674,377 B1 * | 1/2004 | Li | ........................ | G11C 7/1057 341/118 |
| 7,903,011 B2 * | 3/2011 | Werking | ................ | H03M 3/502 323/316 |
| 8,289,431 B2 * | 10/2012 | Itano | ..................... | H04N 5/3651 250/208.1 |
| 8,847,572 B2 * | 9/2014 | Tsai | .......................... | G05F 3/262 323/315 |
| 2008/0174925 A1 * | 7/2008 | Woo | ..................... | H01L 27/0251 361/56 |
| 2008/0191804 A1 * | 8/2008 | An | ......................... | H03F 3/3023 330/255 |
| 2009/0051576 A1 * | 2/2009 | Dedic | .............. | H03K 17/04123 341/136 |
| 2009/0128676 A1 * | 5/2009 | Tanaka | .................... | H04N 5/335 348/300 |
| 2009/0135036 A1 * | 5/2009 | Werking | ................. | G05F 1/561 341/143 |
| 2010/0327844 A1 * | 12/2010 | Ranjan | ..................... | G05F 3/262 323/315 |
| 2011/0254986 A1 * | 10/2011 | Nishimura | ............ | H01L 27/146 348/302 |
| 2012/0081822 A1 * | 4/2012 | Woo | ..................... | H01L 27/0251 361/56 |
| 2012/0086696 A1 * | 4/2012 | Sugiyama | ...... | H03K 19/018521 345/212 |
| 2012/0119063 A1 * | 5/2012 | Takamiya | ............... | H04N 5/374 250/208.1 |
| 2012/0194715 A1 * | 8/2012 | Skaug | ..................... | H04N 5/351 348/300 |
| 2013/0021186 A1 * | 1/2013 | Aude | ..................... | H03M 1/747 341/144 |
| 2013/0039434 A1 * | 2/2013 | Oliaei | .................. | H04B 1/0475 375/259 |

FOREIGN PATENT DOCUMENTS

JP 7-240690 9/1995

* cited by examiner

*Primary Examiner* — Pritham Prabhakher
(74) *Attorney, Agent, or Firm* — Chip Law Group

(57) ABSTRACT

A semiconductor integrated circuit includes: a plurality of current sources including a first transistor individually connected to a power source line and a bias line; and a plurality of bias blocks including a second transistor configured to constitute a current mirror circuit together with the first transistor, and to divide a reference current to be a reference of the current sources so that the reference current flows through the bias line.

16 Claims, 12 Drawing Sheets

US 9,380,237 B2

SEMICONDUCTOR INTEGRATED CIRCUIT, CURRENT CONTROL METHOD, AD CONVERTER, SOLID-STATE IMAGING DEVICE, AND ELECTRONIC SYSTEM

CROSS REFERENCE TO RELATED APPLICATIONS

This application claims the benefit of Japanese Priority Patent Application JP 2012-248392 filed Nov. 12, 2012, the entire contents of which are incorporated herein by reference.

BACKGROUND

The present disclosure relates to a semiconductor integrated circuit, a current control method, an AD converter, a solid-state imaging device, and an electronic system. In particular, the present disclosure relates to a semiconductor integrated circuit, a current control method, an AD converter, a solid-state imaging device, and an electronic system that are capable of reliably reducing influence of an IR drop without an increase in the circuit size.

A current mirror circuit enables easy duplication of an output current, and thus is widely used when a large number of current sources are necessary. For a semiconductor integrated circuit including a current mirror circuit, a DA conversion circuit (DAC: Digital Analog Converter) using a current source is provided as illustrated in FIG. 1, for example.

In a DA conversion circuit in FIG. 1, a current mirror circuit is constituted by a first current source to a sixth current source that include a PMOS transistor individually connected to a power source line 11 and a bias line 12, and a bias block that includes a PMOS transistor through which a reference current Iref flows. In the DA conversion circuit in FIG. 1, a current value of each of currents I1 to I6 flowing through each current source is determined by the difference between a power source voltage and a bias voltage. That is to say, the current value is determined by a gate-source voltage Vgs of each of the PMOS transistors.

In a DA conversion circuit of this kind, an IR drop might occur on the power source line 11. Here, an IR drop is a voltage drop of the IR product that occurs on a power source line when a current abruptly increases. When an IR drop occurs, a voltage Vgs at each current source varies, and thus reduction in the influence of an IR drop is demanded.

In order to reduce the influence of such an IR drop, it is thought that the power source line 11 is strengthened. However, in order to strengthen the power source line 11, it is necessary to thicken the power source line 11, and thus the circuit size increases as a result.

Also, Japanese Unexamined Patent Application Publication No. 7-240690 has been disclosed as a technique for reducing the influence of an IR drop without increasing the circuit size. In Japanese Unexamined Patent Application Publication No. 7-240690, adjacently to a PMOS transistor of each current source included in a DA conversion circuit, a PMOS transistor is disposed in order to give a certain bias between the gate and the source thereof so that an output current from the PMOS transistor of each current source is kept at constant regardless of voltage variations.

SUMMARY

However, in the configuration disclosed in Japanese Unexamined Patent Application Publication No. 7-240690, it is unlikely that an IR drop occurs at the side of the PMOS transistor disposed adjacently. However, no consideration is given to an IR drop that occurs at the side of an NMOS transistor to which a gate bias is given in a predetermined forward direction. As a result, it is difficult to completely eliminate the influence of an IR drop.

In this manner, by the technique disclosed in Japanese Unexamined Patent Application Publication No. 7-240690, it is difficult to say that sufficient countermeasures have been taken against an IR drop.

The present technique has been made in view of these circumstances, and it is desirable to reliably reduce the influence of an IR drop without increasing the circuit size.

According to an embodiment of the present disclosure, there is provided a semiconductor integrated circuit including: a plurality of current sources including a first transistor individually connected to a power source line and a bias line; and a plurality of bias blocks including a second transistor configured to constitute a current mirror circuit together with the first transistor, and to divide a reference current to be a reference of the current sources so that the reference current flows through the bias line.

In the above-described embodiment, a number of the bias blocks disposed may be two.

In the above-described embodiment, a ratio of a reference current configured to flow through the bias line by one of the bias blocks to a reference current configured not to flow through the bias line by the other of the bias blocks may be 1:3.

In the above-described embodiment, the first transistor may include a PMOS transistor, and a gate of the PMOS transistor may be connected to the bias line, and a source thereof may be connected to the power source line, and a drain thereof may be connected to an output terminal.

In the above-described embodiment, the first transistor may include an NMOS transistor, and a gate of the NMOS transistor may be connected to the bias line, and a source thereof may be connected to the power source line, and a drain thereof may be connected to an output terminal.

In the above-described embodiment, the semiconductor integrated circuit may be a DA (Digital Analog) conversion circuit configured to convert a digital signal into an analog signal, and the current source may further include a switching element connected to the first transistor in series, and configured to perform switching operation in accordance with a digital control signal so that a current from the first transistor flows to an output terminal.

According to another embodiment of the present disclosure, there is provided a method of controlling a current of the above-described semiconductor integrated circuit.

According to another embodiment of the present disclosure, there is provided an AD converter including: a DA conversion section including a plurality of current sources including a first transistor individually connected to a power source line and a bias line; and a plurality of bias blocks including a switching element connected to the first transistor in series and configured to perform switching operation in accordance with a digital control signal so that a current from the first transistor flows to an output terminal, and a plurality of bias blocks including a second transistor configured to constitute a current mirror circuit together with the first transistor, and to divide a reference current to be a reference of the current sources into a plurality of currents so that the reference current flows through the bias line; and an AD (Analog Digital) conversion section configured to convert an analog signal to a digital signal on the basis of a reference signal generated by the DA conversion section.

According to another embodiment of the present disclosure, there is provided a solid-state imaging device including:

a pixel array section including a plurality of unit pixels disposed in a two-dimensional state; and an AD conversion section configured to convert an analog pixel signal read from the plurality of unit pixels to a digital signal, wherein the AD conversion section includes a DA conversion section including a plurality of current sources including a first transistor individually connected to a power source line and a bias line, and a plurality of bias blocks including a switching element connected to the first transistor in series and configured to perform switching operation in accordance with a digital control signal so that a current from the first transistor flows to an output terminal, and a plurality of bias blocks including a second transistor configured to constitute a current mirror circuit together with the first transistor, and to divide a reference current to be a reference of the current sources into a plurality of currents so that the reference current flows through the bias line, and the AD conversion section is configured to convert an analog pixel signal to a digital signal on the basis of a reference signal generated by the DA conversion section.

According to another embodiment of the present disclosure, there is provided an electronic system including a solid-state imaging device including: the solid-state imaging device including a pixel array section including a plurality of unit pixels disposed in a two-dimensional state; and an AD conversion section configured to convert an analog pixel signal read from the plurality of unit pixels, wherein the AD conversion section includes a DA conversion section including a plurality of current sources including a first transistor individually connected to a power source line and a bias line, and a plurality of bias blocks including a switching element connected to the first transistor in series and configured to perform switching operation in accordance with a digital control signal so that a current from the first transistor flows to an output terminal, and a plurality of bias blocks including a second transistor configured to constitute a current mirror circuit together with the first transistor, and to divide a reference current to be a reference of the current sources into a plurality of currents so that the reference current flows through the bias line, and the AD conversion section is configured to convert an analog pixel signal to a digital signal on the basis of a reference signal generated by the DA conversion section.

In the above-described embodiments of the present technique, a reference current to be a reference of the plurality of current sources, which are individually connected to a power source line and a bias line, is divided into a plurality of currents, and the currents flow through the bias line.

By the above-described embodiments of the present technique, it is possible to reliably reduce the influence of an IR drop without increasing the circuit size.

DETAILED DESCRIPTION OF EMBODIMENTS

In the following, descriptions will be given of embodiments of the present technique with reference to the drawings.

Example of Configuration of CMOS Image Sensor

Figure 1:
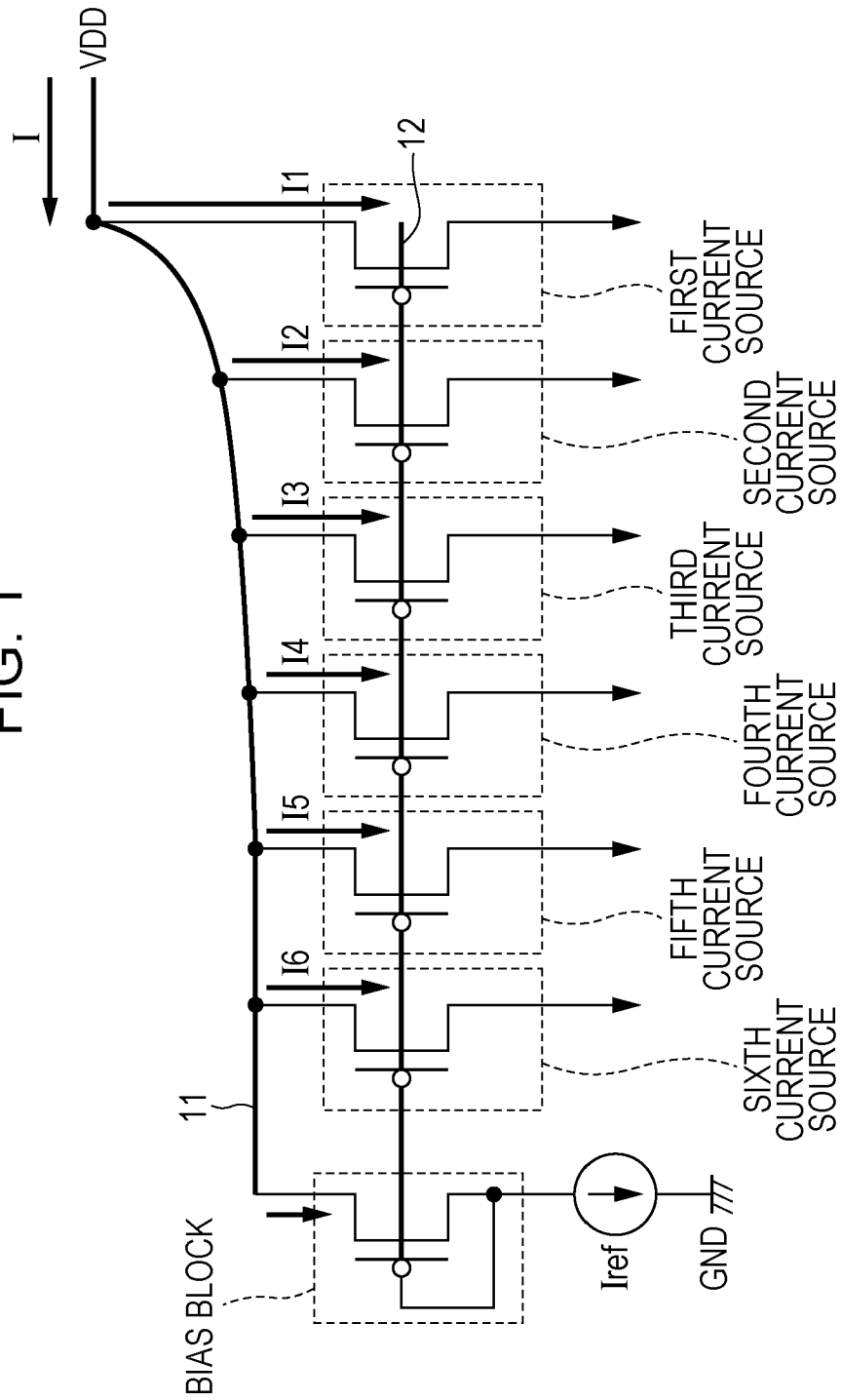
FIG. 1 is a circuit diagram illustrating a configuration of a related-art DA conversion circuit.
Figure 2:
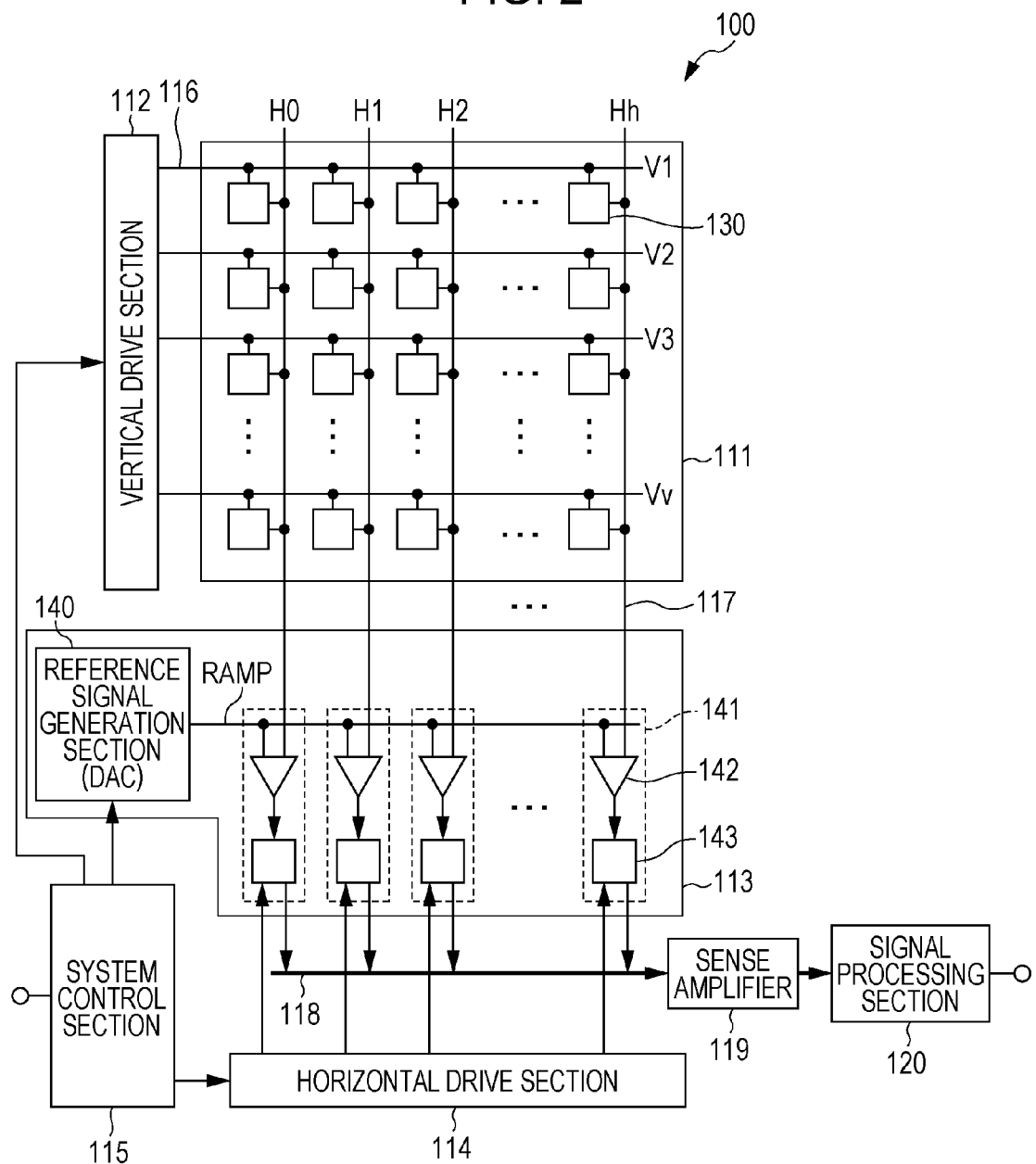
FIG. 2 is a block diagram illustrating an example of a configuration of a CMOS image sensor.

FIG. 2 is a diagram illustrating an example of a configuration of a CMOS image sensor as a solid-state imaging device to which the present technique is applied.

As illustrated in FIG. 2, the CMOS image sensor 100 has a configuration including a pixel array section 111 which is formed on a semiconductor substrate (chip), and a peripheral circuit section which is integrated on the same semiconductor substrate as that of the pixel array section 111. The peripheral circuit section includes a vertical drive section 112, a column processing section 113, a horizontal drive section 114, and a system control section 115.

The pixel array section 111 includes a plurality of unit pixels 130 disposed in a two-dimensional matrix. Each of the unit pixels 130 includes a photoelectric conversion element that generates an amount of photocharge in accordance with an amount of incident light, and accumulates the photocharge inside.

Note that, in FIG. 2, in order to simplify the description, a part of rows and columns are omitted. In reality, a large number of the unit pixels 130 are disposed in each row and each column. Each of the unit pixels 130 typically includes a photodiode as a light receiving element, and an amplifier in a pixel, which includes a semiconductor device for amplification, such as a transistor, and so on. For the amplifier in a pixel, for example, a floating diffusion amplification configuration is used.

In the pixel array section 111, further, a pixel drive line 116 is formed with respect to a matrix-state pixel array for each pixel row along the horizontal direction in FIG. 2 (the pixel arrangement direction of a pixel row), and a vertical signal line 117 is formed for each column along the vertical direction in FIG. 2 (the pixel arrangement direction of a pixel column). Note that, in FIG. 2, one pixel drive line 116 is illustrated as one wire line, but is not limited to one line. Also, one end of the pixel drive line 116 is connected to an end terminal corresponding to each row of the row scanning section 112.

The vertical drive section 112 includes a shift register and an address decoder, and so on, and drives each pixel of the pixel array section 111 simultaneously for all the pixels, or for each row, and the like in accordance with a control signal from the system control section 115. A specific configuration of the vertical drive section 112 is omitted from the illustration. In general, the vertical drive section 112 has a configuration including two scanning systems, namely, a read scanning system and a sweep scanning system.

The read scanning system performs selective scanning on the unit pixels 130 of the pixel array section 111 for each row in sequence in order to read signals from the unit pixels 130. The sweep scanning system performs sweep scanning on a row from which read scanning is performed by the read scanning system in advance of the read scanning by an amount of time matching a shutter speed.

The signal output from each of the unit pixels 130 in the pixel row having been subjected to the selective scanning performed by the vertical drive section 112 is supplied to the column processing section 113 through a corresponding one of the vertical signal lines 117.

The column processing section 113 performs predetermined signal processing on the signal output from each of the unit pixels 130 in the selected row of the pixel array section 111 for each pixel column through the vertical signal line 117. Also, the column processing section 113 has an AD conversion function as an AD conversion circuit (Analog Digital Converter), and is capable of outputting a signal level as a digital signal.

Specifically, the pixel signal output from each of the unit pixels 130 is input into a column AD conversion section 141 of the column processing section 113 through the vertical signal line 117. Also, a reference signal generation section (DAC: Digital Analog Converter) 140 generates a reference signal RAMP having a ramp state voltage in response to a control signal from the system control section 115, and supplies the reference signal RAMP to each of the column AD conversion sections 141.

In each of the column AD conversion sections 141, when the reference signal RAMP is supplied from the reference signal generation section 140 to a comparator 142, a counter 143 starts counting by a clock signal at the same time with that timing. And in each of the column AD conversion sections 141, an analog pixel signal that has been input through the vertical signal line 117 is compared with the reference signal RAMP so that counting is performed until a pulse signal is obtained, and thereby AD conversion is performed.

That is to say, each of the column AD conversion sections 141 searches a point at which the voltage level of the reference signal RAMP having a ramp waveform that increases or decreases with a predetermined slope matches each voltage level of the reference component and the signal component in the pixel signal from the unit pixel 130. And a time period from a point in time when a reference signal RAMP used for the comparison processing is generated to a point in time when a signal corresponding to a reference component or a signal component in a pixel signal matches the reference signal RAMP is counted by the count clock. Thereby, it is possible to obtain count values corresponding to the reference component and the signal component.

In this regard, a description will be given later of the details of an AD conversion function of the column processing section 113.

Also, although not illustrated in FIG. 2, the column processing section 113 has at least, a noise reduction function as signal processing in addition to an AD conversion function. Specifically, the column processing section 113 performs, for example, CDS (Correlated Double Sampling) processing as noise reduction processing. By the CDS processing by the column processing section 113, pixel-specific pattern noise, such as reset noise, variations of threshold values of amplification transistors, and so on, is removed.

The horizontal drive section 114 includes a shift register, an address decoder, and so on, and selects a unit circuit corresponding to a pixel column of the column processing section 113 in sequence in response to a control signal from the system control section 115. The horizontal drive section 114 performs selective scanning so that the column processing section 113 obtains a count value in accordance with a pixel signal, and outputs the count value to a sense amplifier 119 through the horizontal signal line 118.

The sense amplifier 119 converts the count value from the column processing section 113 into an output code corresponding thereto. Thereby, the analog pixel signal is converted into a digital signal, and the digital signal is supplied to the signal processing section 120.

The signal processing section 120 performs predetermined signal processing on the digital signal output from the sense amplifier 119.

The system control section 115 includes a timing generator that generates various timing signals, and so on, and performs drive control on, such as the vertical drive section 112, the column processing section 113, and the horizontal drive section 114, and so on, on the basis of the various timing signals generated by the timing generator.

With such a configuration, the pixel array section 111 outputs a pixel signal of each vertical column for each row in sequence. And one piece of image corresponding to the pixel array section 111 in which light receiving elements are disposed in a matrix, that is to say, one frame image is obtained as a set of pixel signals of the entire pixel array section 111.

AD Conversion Function of Column Processing Section

Here, a description will be given of details of the AD conversion function of the column processing section 113 including the reference signal generation section 140 and the column AD conversion section 141.

The reference signal generation section 140 generates a stepwise sawtooth wave (ramp waveform) on the basis of a control signal from the system control section 115. The reference signal generation section 140 supplies the generated sawtooth wave to each of the column AD conversion sections 141 of the column processing section 113 as a reference signal RAMP (ADC reference voltage) for AD conversion.

The control signal supplied from the system control section 115 to the reference signal generation section 140 includes information for making a rate of change of the digital signal identical in time so that the ramp voltage for each comparison processing has the same slope (rate of change).

The column AD conversion section 141 is disposed for each column of the unit pixel 130 included in the pixel array section 111. Each of the column AD conversion sections 141 includes a comparator 142 and a counter 143.

The reference signal RAMP from the reference signal generation section 140 is input into one of input terminals of the comparator 142 in common with one of input terminals of the other comparators 142. The vertical signal line 117 in a vertical column corresponding to each of the comparators 142 is connected to the other of the input terminals, and each analog pixel signal from the pixel array section 111 is input.

The comparator 142 compares the reference signal RAMP from the reference signal generation section 140 with the analog pixel signal obtained from a unit pixel 130 for each of the pixel drive lines 116 (V0, V1, . . . , Vv) through a vertical signal line 117 (H0, H1, . . . , Hh). The output terminal of the comparator 142 is connected to the counter 143, and the comparator 142 outputs a result of the comparison processing to the counter 143.

The counter 143 counts time until the comparison processing in the comparator 142 is complete. Specifically, the counter 143 counts time until the voltage level of the pixel signal and the voltage level of the reference signal RAMP intersect. The counter 143 is connected to the sense amplifier 119 through the horizontal signal line 118, and outputs a count value (comparison time) to the sense amplifier 119.

The sense amplifier 119 converts the comparison time (count value) input from each of the counters 143 into an output code corresponding the comparison time. Thereby, the analog pixel signal is converted into a digital signal. The sense amplifier 119 outputs the converted output code to the signal processing section 120 in sequence.

The CMOS image sensor 100 is configured as described above.

Detailed configuration (first configuration) of reference signal generation section (DAC)

Next, a description will be given of a detailed configuration of the reference signal generation section 140 in FIG. 2 with reference to FIG. 3. In this regard, in FIG. 3, in order to simplify the description, only six current sources are illustrated. However, a still larger number of current sources are connected in parallel.

Figure 3:
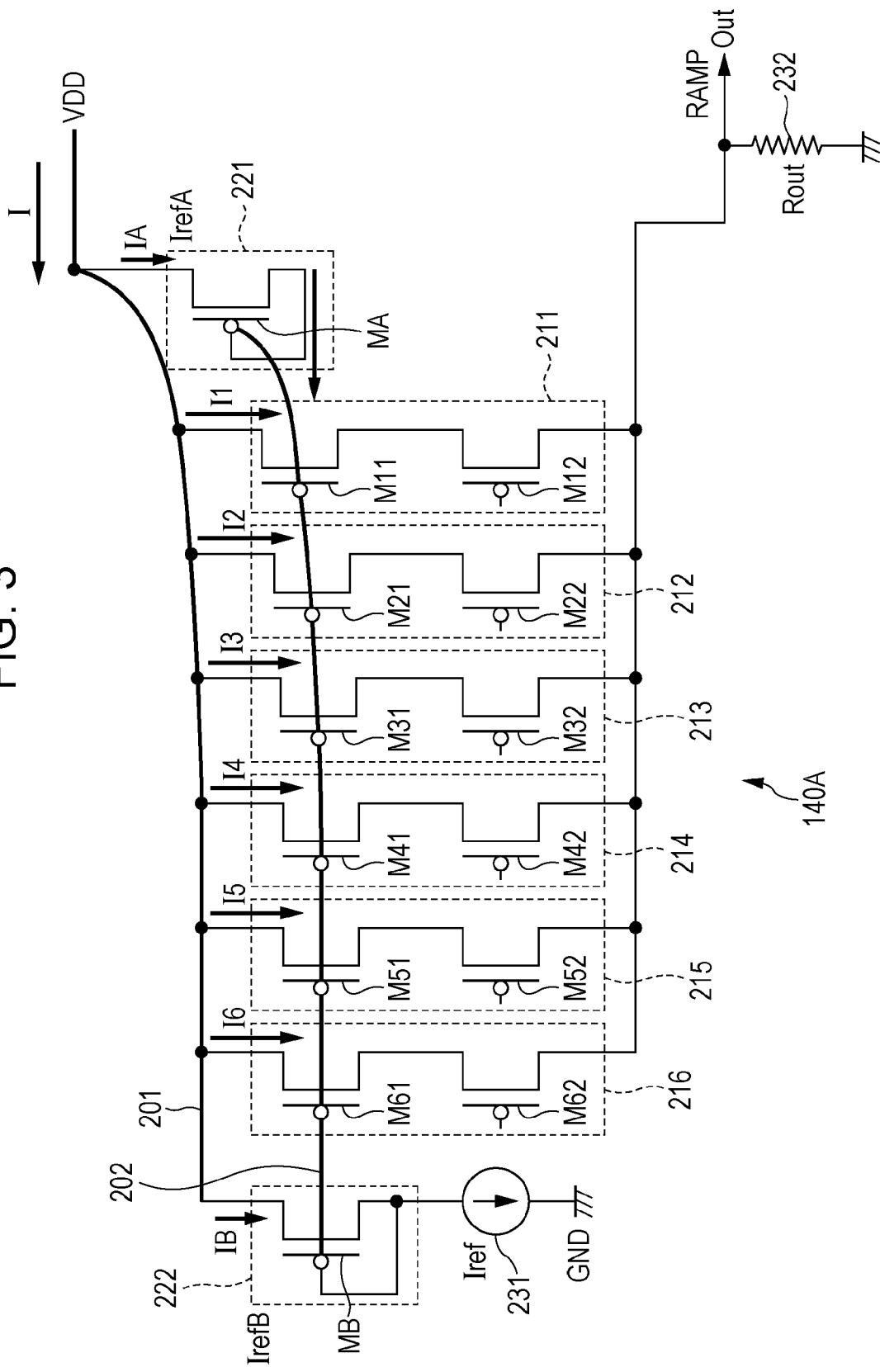
FIG. 3 is a circuit diagram illustrating a detailed configuration (first configuration) of a reference signal generation section.

As illustrated in FIG. 3, a reference signal generation section 140A includes a first current source 211 to a sixth current source 216, a first bias block 221, a second bias block 222, a referenced current source 231, and an output resistor 232.

The first current source 211 includes a PMOS transistor M11 and a PMOS transistor M12. In the PMOS transistor M11, the gate terminal thereof is connected to a bias line 202, the source terminal thereof is connected to a power source line 201, and the drain terminal thereof is connected to the source terminal of the PMOS transistor M12. The current value of a current I1 flowing through the first current source 211 is determined by the difference between the power source voltage and the bias voltage, that is to say, a gate-source voltage Vgs of the PMOS transistor M11.

The gate terminal of the PMOS transistor M12 is connected to a supply terminal (not illustrated in the figure) of a first switching control signal SW1 supplied from the system control section 115. That is to say, the PMOS transistor M12 is subjected to on/off control in accordance with the inverted signal of the first switching control signal SW1. Also, the source terminal of the PMOS transistor M12 is connected to the drain terminal of the PMOS transistor M11, and the drain terminal thereof is connected to an output terminal (Out) of the reference signal RAMP and one of the terminals of the output resistor 232 (resistance value Rout).

A second current source 212 is connected in parallel with the other current sources, such as the first current source 211, and so on, and includes a PMOS transistor M21 as a current source, and a PMOS transistor M22 as a switching element. Also, the PMOS transistors M21 and M22 have a same connection relationship as that of the PMOS transistors M11 and M12.

A third current source 213 to a sixth current source 216 are connected in parallel with the other current sources, such as the first current source 211, and so on. PMOS transistors included in those current sources have a same connection relationship as that of the PMOS transistor included in the first current source 211.

The first bias block 221 includes a PMOS transistor MA. The gate terminal of the PMOS transistor MA is connected to the bias line 202, and the source terminal of the PMOS transistor MA is connected to the power source line 201. Also, the gate terminal of the PMOS transistor MA is connected to the drain terminal of itself (diode-connected).

The second bias block 222 includes a PMOS transistor MB. The gate terminal of the PMOS transistor MB is connected to the bias line 202, and the source terminal of the PMOS transistor MB is connected to the power source line 201. Also, the gate terminal of the PMOS transistor MB is connected to the drain terminal of itself (diode-connected). Further, the drain terminal of the PMOS transistor MB is connected to the referenced current source 231.

The current-inflow side terminal of the referenced current source 231 is connected to the drain terminal of the PMOS transistor MB, and the current-outflow side terminal is connected to ground.

The drain terminals of the PMOS transistors M12, M22, M32, M42, M52, and M62 are connected to the output terminal (Out) of the reference signal RAMP, and one terminal of the output resistor 232 (resistance value Rout). In this regard, the other terminal of the output resistor 232 is connected to ground.

In the reference signal generation section 140A configured as described above, a current mirror circuit is configured between the PMOS transistor MA and the PMOS transistor MB, the PMOS transistor M11, the PMOS transistor M21, the PMOS transistor M31, the PMOS transistor M41, the PMOS transistor M51, and the PMOS transistor M61. In the current mirror circuit, the first bias block 221 including the PMOS transistor MA, and the second bias block 222 including the PMOS transistor MB are mirror sources of the current mirror circuit.

Also, each of the current sources is subjected to on/off control in accordance with the corresponding switch control signal (SW1 to SW6). In the following description, when the PMOS transistor connected to the output resistor 232 is in an on-state, the current source is said to be in an on-state. That is to say, the voltage level of the reference signal RAMP output from the output terminal varies in accordance with the on-state of each of the current sources.

When the first current source 211 is in the on-state, a current I1 flows through the PMOS transistors M11 and M12. In the same manner, when the second current source 212 to the sixth current source 216 are individually in the on-state, a current I2 to a current I6 flow through the individual PMOS transistors included in those current sources, respectively. Also, a bias current IA flows through the PMOS transistor MA of the first bias block 221. Further, a bias current IB flows through the PMOS transistor MB of the second bias block 222.

At this time, a current I corresponds to the amount of the sum current of the current values of the current I1 to the current I6, and the current value of the reference current Iref. Also, the bias current IA flows through the first bias block 221, and thereby the reference current IrefA is obtained. On the other hand, the bias current IB flows through the second bias block 222, and thereby the reference current IrefB is obtained.

That is to say, in the reference signal generation section 140A, two bias blocks, namely the first bias block 221 and the second bias block 222, are disposed so that the reference current Iref to be a reference of the current source is divided into two currents, the reference current IrefA and the reference current IrefB in order to control the current flowing through the bias line 202.

The reason for this is as follows. That is to say, in order to suppress an IR drop that occurs on the power source line 201, there is a method of causing an IR drop to occur on the bias line 202 to get the balance of IR drops. However, in general, in order not to allow the current to flow through the bias line 202, it is necessary to make the resistance value relatively large. And in order to make IR drops of the bias line 202 and the power source line 201 equal, it is necessary to configure the bias line 202 to be thick. If a current is caused to simply flow through the bias line 202 to generate an IR drop for that purpose, the circuit size increases as a result.

Thus, in the reference signal generation section 140A, the reference current Iref is divided into the reference current IrefA and the reference current IrefB. And the divided reference current IrefA flows through the bias line 202 so that an IR drop also occurs on the bias line 202. Thereby, it becomes unnecessary to strengthen the bias line 202, and thus it is possible to reduce the influence of the IR drop without increasing the circuit size as a result.

Operation of Reference Signal Generation Section (DAC)

Next, a description will be given of operation of the reference signal generation section 140A. First, if all the current sources become the off-state, the reference signal RAMP of a minimum voltage level (ground level) is output.

Next, further, after a lapse of a predetermined time period, the first current source is changed to the on-state. Thereby, in the first current source 211, a current flows from the PMOS transistor M11 to the PMOS transistor M12, and the voltage level of the reference signal RAMP output from the reference signal generation section 140A increases.

Next, further, after a lapse of a predetermined time period, the second current source 212 is changed to the on-state while keeping the first current source 211 in the on-state. As a result, the amount of current that flows to the output terminal (Out) of the reference signal RAMP increases, and the voltage level of the reference signal RAMP further increases. After that, after a lapse of a predetermined time period, the third current source 213 to the sixth current source 216 are changed to the on-state in sequence so that the output voltage level of the reference signal RAMP linearly increases with the lapse of time.

In this manner, in the reference signal generation section 140A, the reference signal RAMP, which increases in time with a predetermined slope and which has a voltage level waveform that increases with a predetermined dynamic range, is generated and output.

Also, in the reference signal generation section 140A, the current value of each current source is uniformized without being influenced by an IR drop, and thus the waveform of the reference signal RAMP is not curved, thereby it is possible to ensure the linearity of the voltage level of the reference signal RAMP in time.

In the above, in the reference signal generation section 140A, the PMOS transistors M12, M22, M32, M42, M52, and M62 perform switching operation in accordance with the switch control signals (SW1 to SW6), which are digital signals, so that the currents from the PMOS transistors M11, M21, M31, M41, M51, and M61 flow to the output terminal (Out), and are output as the reference signal RAMP, which is an analog signal. In this manner, the reference signal generation section 140A operates as a DA conversion circuit that converts a digital signal into an analog signal.

Details of Simulation

Incidentally, a technique of reducing the influence of an IR drop by disposing a plurality of bias blocks was found by detailed simulations performed by inventors of the present technique. Thus, a description will be given of the details of the simulations next with reference to FIG. 4 to FIG. 8.

Simulation Conditions

Figure 4:
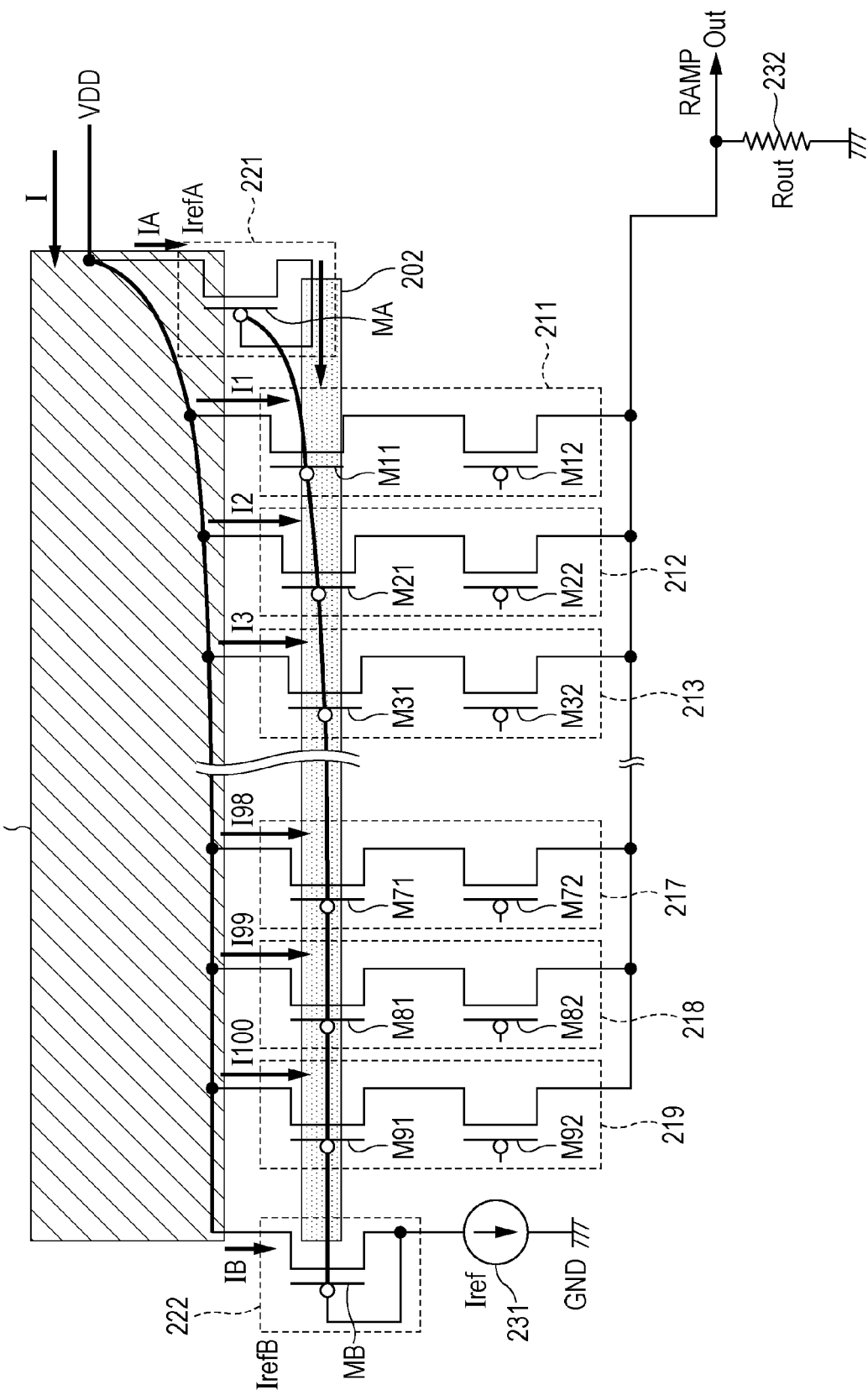
FIG. 4 is a diagram for explaining conditions of simulations.

FIG. 4 is a diagram for explaining conditions of simulations performed by the reference signal generation section 140A. In this regard, in FIG. 4, in order to compare the thickness of the power source line 201 and that of the bias line 202, the thickness is illustrated specifically. That is to say, in general, in order not to allow a current to flow through the bias line 202, the resistance value thereof becomes large compared with that of the power source line 201.

The simulations are performed under the following conditions.

Number of current sources: 100
Resistance of the power source line 201: 1Ω
Resistance of the bias line 202: 15Ω
Current value of current flowing through each current source (unit current): 0.3 mA
Total value of the current values of currents flowing through individual current sources: 30 mA (0.3 mA×100)
Current value of the reference current Iref: 6 mA And the simulations are performed by fixing the above conditions, and varying the division rate of the reference current Iref.

That is to say, the division rate of the reference current Iref is varied by setting the reference current IrefA of the first bias block 221 and the reference current IrefB of the second bias block 222 as the following cases: case1 to case4, respectively.

Case1: Reference current IrefA 1.5 mA, and reference current IrefB 4.5 mA
Case2: Reference current IrefA 0 mA, and reference current IrefB 6 mA
Case3: Reference current IrefA 3 mA, and reference current IrefB 3 mA
Case4: Reference current IrefA 6 mA, and reference current IrefB 0 mA In the following, specific simulation results in the cases from case1 to case4 are illustrated.

Case1: IrefA is 1.5 mA and IrefB is 4.5 mA

Figure 5:
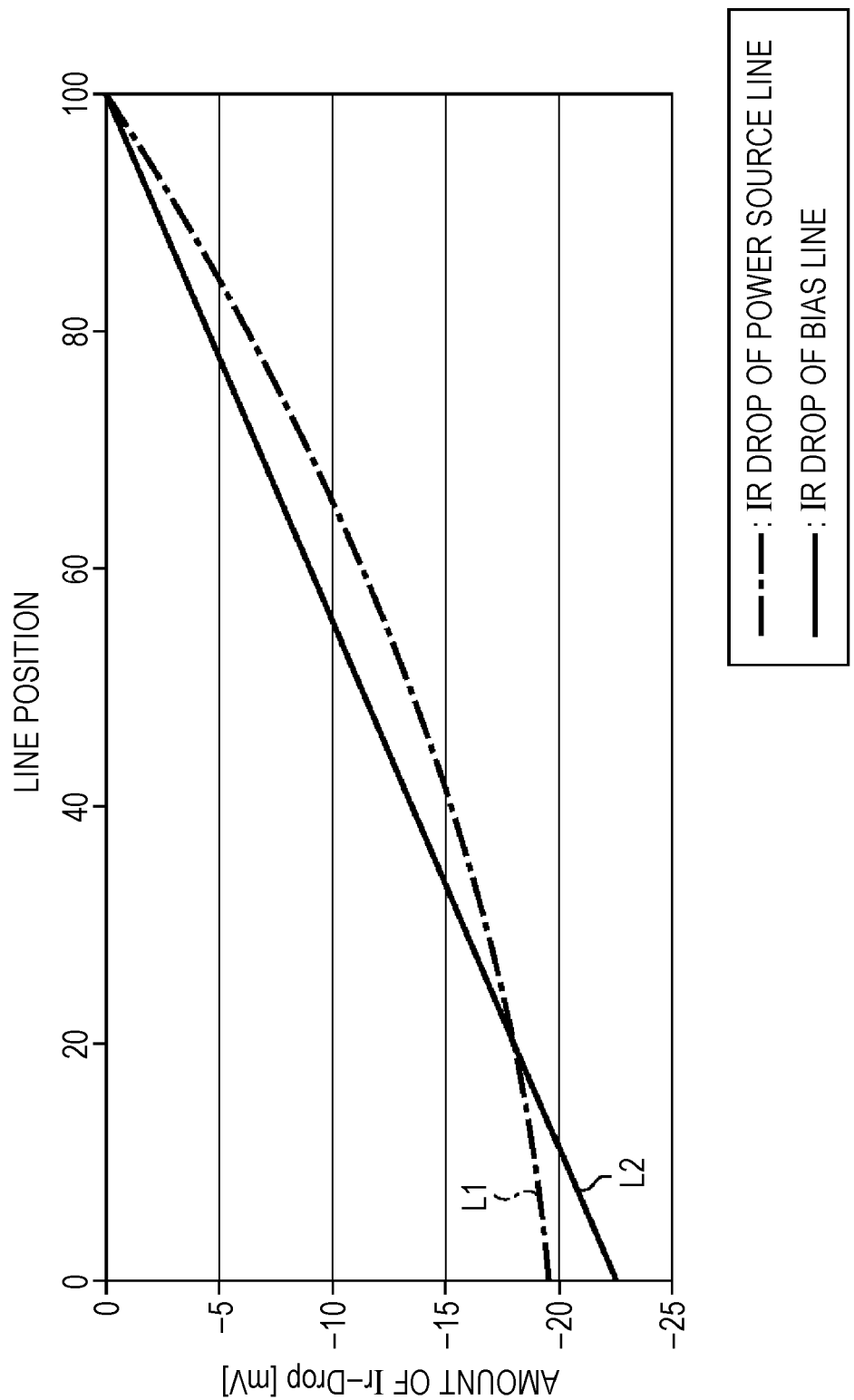
FIG. 5 is a diagram illustrating a simulation result (IrefA=1.5 mA, and IrefB=4.5 mA)

FIG. 5 is a diagram illustrating a simulation result of case1.

In FIG. 5, the horizontal axis corresponds to a wiring position of the power source line 201 and the bias line 202 in FIG. 4, and numeric values given on the axis represents the number of current sources. Also, the vertical axis represents the amount of IR drop (unit mV), and the amount of voltage drop increases downward from top in FIG. 5.

Also, in case1, the reference current IrefA and the reference current IrefB are produced such that the reference current Iref is divided at a rate of 1:3.

In FIG. 5, a line L1 indicating an IR drop of the power source line 201 (a dash-single-dot line in FIG. 5) is a curve that is convex downward. And the farther from the power source VDD, the larger the amount of IR drop becomes. Also, a line L2 indicating an IR drop of the bias line 202 (a solid line in FIG. 5) is a substantially straight line. And the farther from the power source VDD, the larger the amount of IR drop becomes.

A comparison of these two lines indicates that the line L1 indicating an IR drop of the power source line 201 and the line L2 indicating an IR drop of the bias line 202 have a little difference, but have approximate shapes and approximate amounts of IR drops at the corresponding wiring positions. Accordingly, in the case of case1, it is possible to balance the IR drop by an IR drop that occurs on the bias line 202.

Case2: IrefA is 0 mA and IrefB is 6 mA

Figure 6:
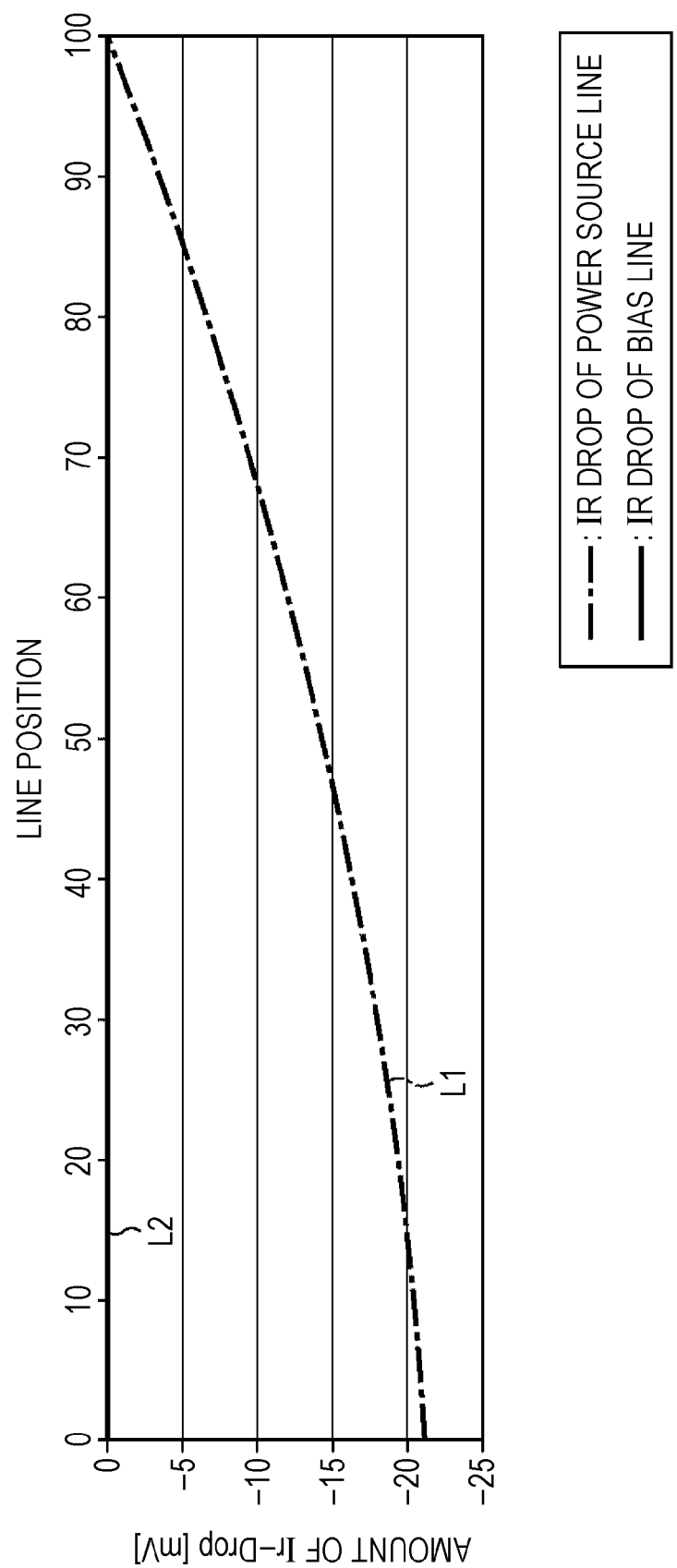
FIG. 6 is a diagram illustrating a simulation result (IrefA=0 mA, and IrefB=6 mA)

FIG. 6 is a diagram illustrating a simulation result of case2. In FIG. 6, a relationship of the axes, and so on is the same as that in FIG. 5. Also, in case2, IrefA becomes 0 mA, and thus a current does not flow through the bias line 202.

In FIG. 6, in the same manner as in the case in FIG. 5, a line L1 indicating an IR drop of the power source line 201 is a curve that is convex downward. And the farther from the power source VDD, the larger the amount of IR drop becomes. On the other hand, a line L2 indicating an IR drop of the bias line 202 becomes a substantially straight line. However, a current dose not flow through the bias line 202, thus the amount of IR drop becomes zero at all the wiring positions. And it is difficult to generate an IR drop.

A comparison of these two lines indicates that the line L1 indicating an IR drop of the power source line 201 and the line L2 indicating an IR drop of the bias line 202 are greatly different in the amount of IR drop of the corresponding wiring positions. Accordingly, in the case of case2, it is difficult to balance the IR drops by the IR drop that occurs on the bias line 202.

Case3: IrefA is 3 mA and IrefB is 3 mA

Figure 7:
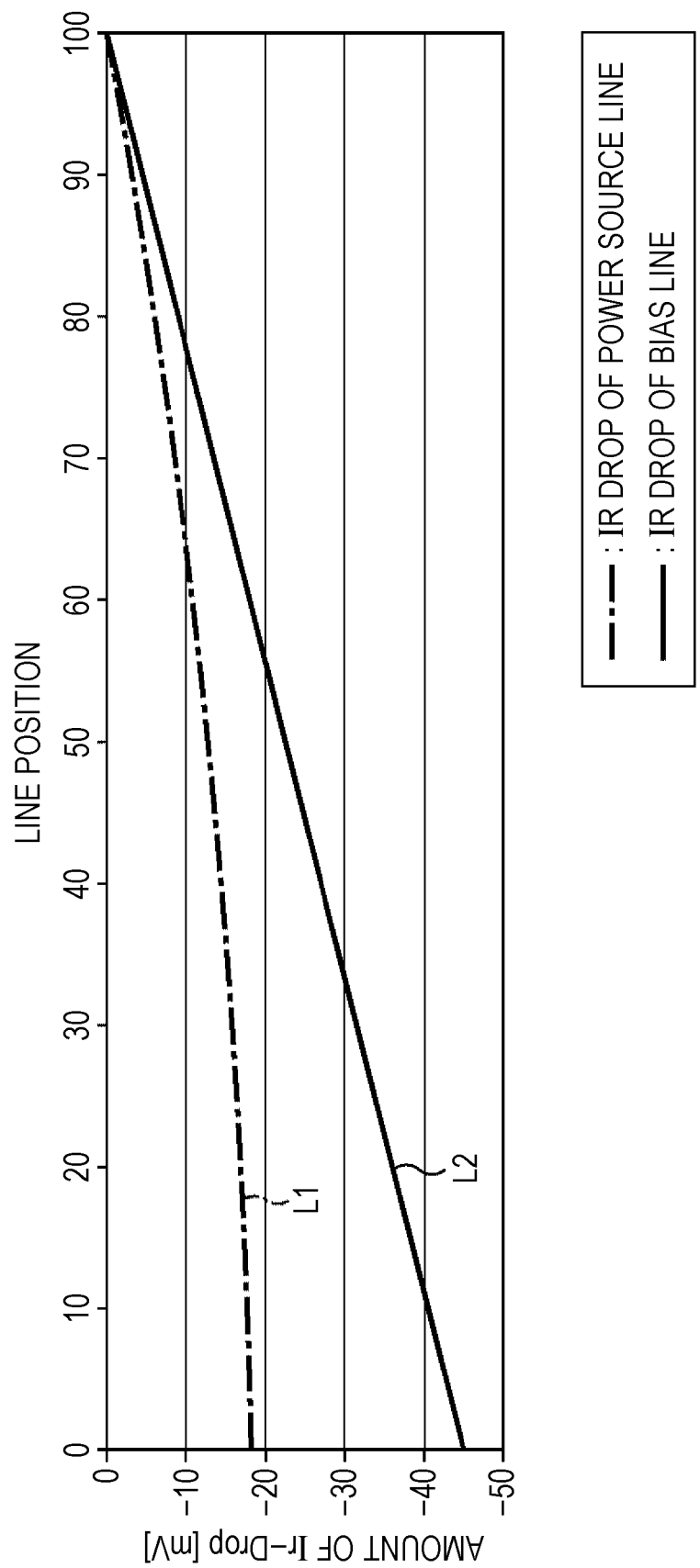
FIG. 7 is a diagram illustrating a simulation result (IrefA=3 mA, and IrefB=3 mA)

FIG. 7 is a diagram illustrating a simulation result of case3. In FIG. 7, a relationship of the axes, and so on is the same as that in FIG. 5. Also, in case3, the reference current IrefA and the reference current IrefB are produced such that the reference current Iref is divided at a rate of 1:1.

In FIG. 7, a line L1 indicating an IR drop of the power source line 201 is a curve that is convex downward in the same manner as in the case in FIG. 5. And the farther from the power source VDD, the larger the amount of IR drop becomes. On the other hand, a line L2 indicating an IR drop of the bias line 202 is a substantially straight line. And the farther from the power source VDD, the larger the amount of IR drop becomes.

A comparison of these two lines indicates that the line L1 indicating an IR drop of the power source line 201 and the line L2 indicating an IR drop of the bias line 202 are greatly different in the amount of IR drop of the corresponding wiring positions. Accordingly, in the case of case3, it is difficult to balance the IR drops by the IR drop that occurs on the bias line 202.

Case4: IrefA is 6 mA and is IrefB 0 mA

Figure 8:
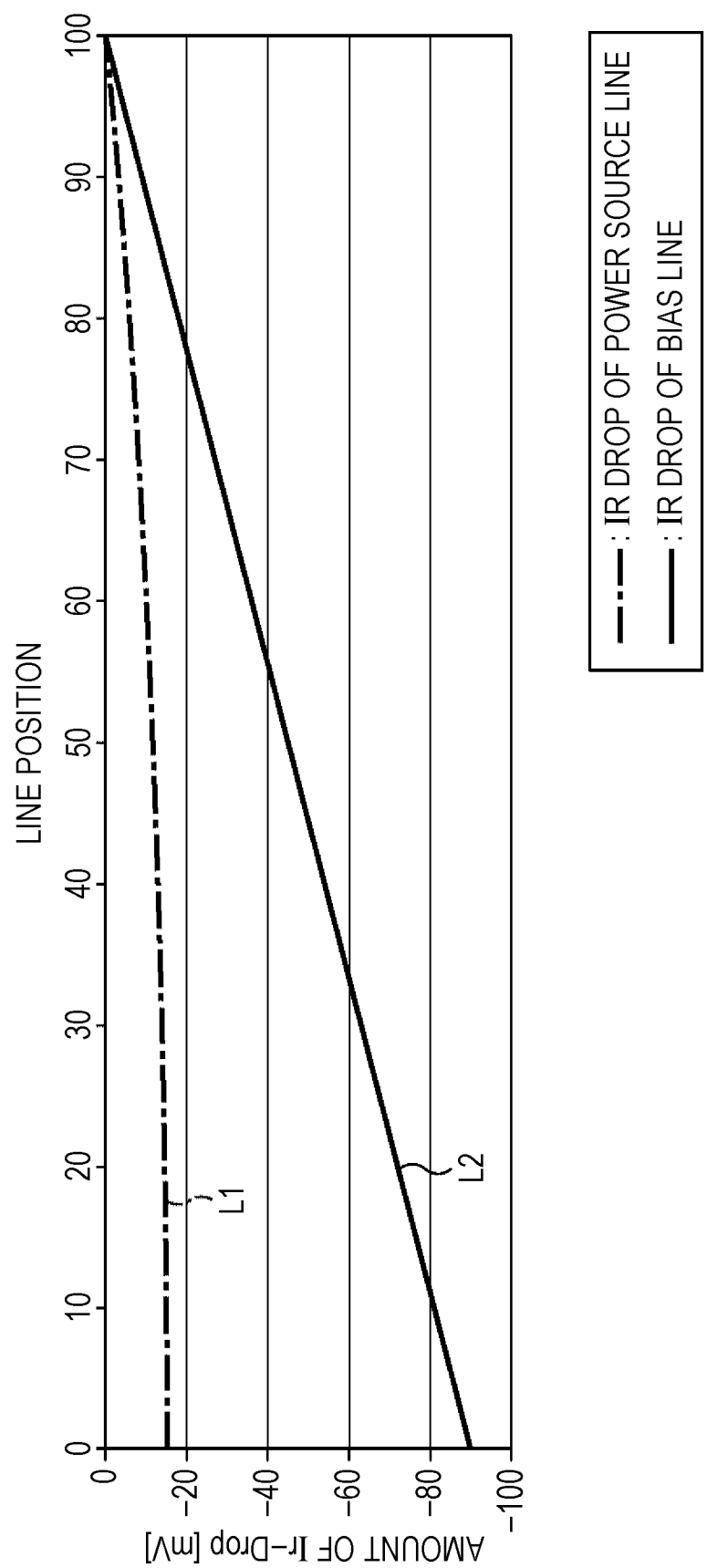
FIG. 8 is a diagram illustrating a simulation result (IrefA=6 mA, and IrefB=0 mA)

FIG. 8 is a diagram illustrating a simulation result of case4. In FIG. 8, a relationship of the axes, and so on is the same as that in FIG. 5. Also, in case4, IrefA becomes 6 mA, and thus all the reference current Iref flows through the bias line 202.

In FIG. 8, a line L1 indicating an IR drop of the power source line 201 is a curve that is convex downward in the same manner as in the case in FIG. 5. And the farther from the power source VDD, the larger the amount of IR drop becomes. On the other hand, a line L2 indicating an IR drop of the bias line 202 is a substantially straight line. And the farther from the power source VDD, the larger the amount of IR drop becomes.

A comparison of these two lines indicates that the line L1 indicating an IR drop of the power source line 201 and the line L2 indicating an IR drop of the bias line 202 are greatly different in the amount of IR drop of the corresponding wiring positions. Accordingly, in the case of case4, it is difficult to balance the IR drops by the IR drop that occurs on the bias line 202.

In the above, as illustrated in the simulation results in FIG. 5 to FIG. 8, when the simulations are performed by varying a division rate of the reference current Iref, in the case of using the setting values of case1 (IrefA is 1.5 mA, and IrefB is 4.5 mA) among case1 to case4, an IR drop is caused to occur on the bias line 202 in a most ideal way.

That is to say, in the reference signal generation section 140A, when the first bias block 221 and the second bias block 222 are disposed, the reference current Iref is divided such that the reference current IrefA and the reference current IrefB those bias blocks are divided at a rate of 1:3 so that the IR drop is allowed to occur on the bias line 202 in a most ideal way. As a result, the IR drop that occurs on the power source line 201 and the IR drop that occurs on the bias line 202 are balances, and thus it is possible to reduce the influence of an IR drop.

Also, at this time, the reference current Iref is divided into the reference current IrefA and the reference current IrefB, and the divided reference current IrefA flows through the bias line 202, and thus it is not necessary to configure to thicken the bias line 202. As a result, it becomes possible to reduce the influence of an IR drop without increasing the circuit size.

Another configuration (second configuration) of reference signal generation section (DAC)

Figure 9:
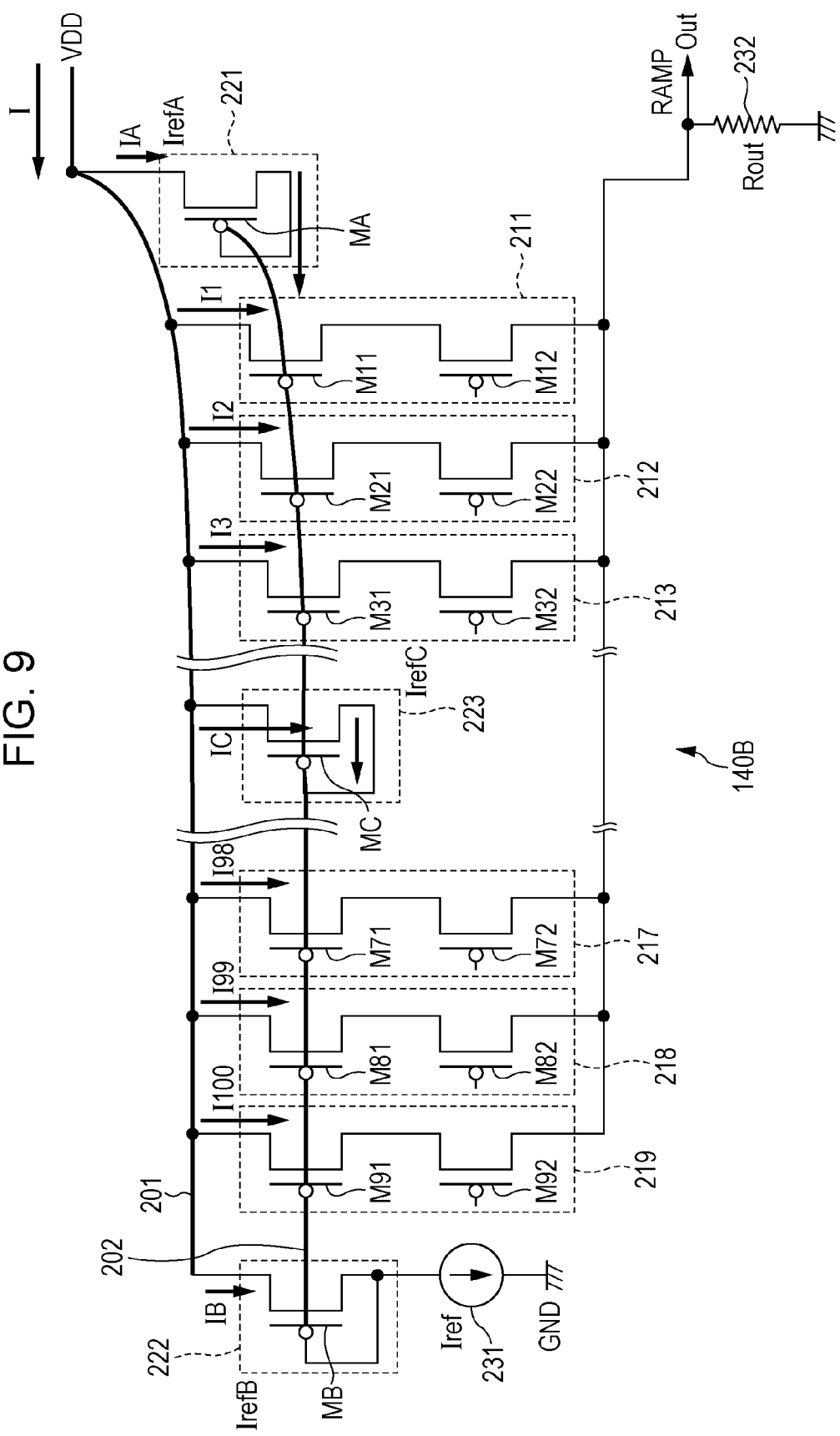
FIG. 9 is a circuit diagram illustrating a detailed configuration (second configuration) of a reference signal generation section.

FIG. 9 is a diagram illustrating another configuration of the reference signal generation section 140 in FIG. 2. That is to say, in the reference signal generation section 140A in FIG. 3, the case where two bias blocks are disposed is illustrated. However, the number of bias blocks is not limited to two, and two or more bias blocks may be disposed. In a reference signal generation section 140B in FIG. 9, as one example of the cases of disposing a plurality of bias blocks, a case of disposing three bias blocks is illustrated.

As illustrated in FIG. 9, the reference signal generation section 140B includes a first current source 211 to a 100-th current source 219, a first bias block 221, a second bias block 222, a third bias block 223, a referenced current source 231, and an output resistor 232. In this regard, in FIG. 9, in order to simplify the description, only six current sources are illustrated. In reality, 100 current sources are disposed. Also, in FIG. 9, a same symbol is added to a part corresponding to that in FIG. 3, and the description thereof is suitably omitted.

The first bias block 221 and the second bias block 222 are configured in the same manner as the first bias block 221 and the second bias block 222 in FIG. 3, respectively.

The third bias block 223 includes a PMOS transistor MC. The gate terminal of the PMOS transistor MC is connected to the bias line 202, and the source terminal of the PMOS transistor MC is connected to the power source line 201. Also, the gate terminal of the PMOS transistor MC is connected to the drain terminal of itself (diode-connected).

In the reference signal generation section 140B, a current mirror circuit is configured between the PMOS transistor MA, the PMOS transistor MB, and the PMOS transistor MC, and the PMOS transistor M11 to the PMOS transistor M91. In the current mirror circuit, the first bias block 221 including the PMOS transistor MA, the second bias block 222 including the PMOS transistor MB, and the third bias block 223 including the PMOS transistor MC are mirror sources of the current mirror circuit.

Also, each of the current sources is subjected to on/off control in accordance with the corresponding switch control signal (SW1 to SW100). When the first current source 211 to the 100-th current source 219 are individually in the on-state, a current I1 to a current I100 flow through the individual PMOS transistors included in those current sources, respectively. Also, a bias current IA flows through the PMOS transistor MA of the first bias block 221, and a bias current IB flows through the PMOS transistor MB of the second bias block 222. Further, a bias current IC flows through the PMOS transistor MC of the third bias block 223.

At this time, a current I corresponds to the amount of the sum current of the current values of the current I1 to the current I100, and the current value of the reference current Iref. Also, the bias current IA flows through the first bias block 221, and thereby the reference current IrefA is obtained. The bias current IB flows through the second bias block 222, and thereby the reference current IrefB is obtained. On the other hand, the bias current IC flows through the third bias block 223, and thereby the reference current IrefC is obtained.

That is to say, in the reference signal generation section 140B, three bias blocks, namely the first bias block 221, the second bias block 222, and the third bias block 223, are disposed so that the reference current Iref to be a reference of the current source is divided into three currents, the reference current IrefA, the reference current IrefB, and the reference current IrefC so that the current flowing through the bias line 202 is controlled.

And in the reference signal generation section 140B, the reference current Iref is divided into the reference current IrefA, the reference current IrefB, and the reference current IrefC. And the divided reference current IrefA and reference current IrefC flow through the bias line 202 so that an IR drop also occurs on the bias line 202. Thereby, it is not necessary to strengthen the bias line 202, thereby it is possible to reduce the influence of the IR drop without increasing the circuit size as a result.

Specifically, when three or more bias blocks are disposed like the reference signal generation section 140B, it is possible to pull the current into the bias line 202, and thus a line indicating an IR drop on the bias line 202 (L2) becomes a curve that is convex upward. Also, in the simulation results in the case of disposing two bias blocks, described above (FIG. 5 to FIG. 8), a line L1 indicating an IR drop of the power source line 201 was a curve that is convex downward. However, it is also assumed that the curve becomes convex upward.

In this case, it becomes possible to balance the IR drops by the IR drop that occurs on the bias line 202. Also, there is an advantage in that the larger number of bias blocks are disposed, the higher the degree of freedom of the IR drop becomes on the power source line 201.

Also, in the reference signal generation section 140A in FIG. 3 and the reference signal generation section 140B in FIG. 9, the descriptions have been given of the cases of using a PMOS transistor as a transistor included in the current mirror circuit. The reference signal generation section 140 in FIG. 2 operates as a ground reference DAC in the case of using a PMOS transistor, and thus when a current does not flow through the current source, the output voltage level of the reference signal RAMP becomes 0 (ground). And the larger the number of the current sources through which a current flow, the higher the output voltage level linearly becomes.

Accordingly, in the case of employing a configuration using a PMOS transistor, even if noise is input to the power source VDD, the output voltage level of the reference signal RAMP does not fluctuate, and thus it is possible to ensure linearity of the voltage level to the reference signal RAMP in time.

For example, in consumer electronic systems, there are cases where the power source VDD is unstable, and thus the present configuration is suitable for applying the CMOS image sensor 100 to consumer electronic systems.

Another configuration (third configuration) of reference signal generation section (DAC)

Figure 10:
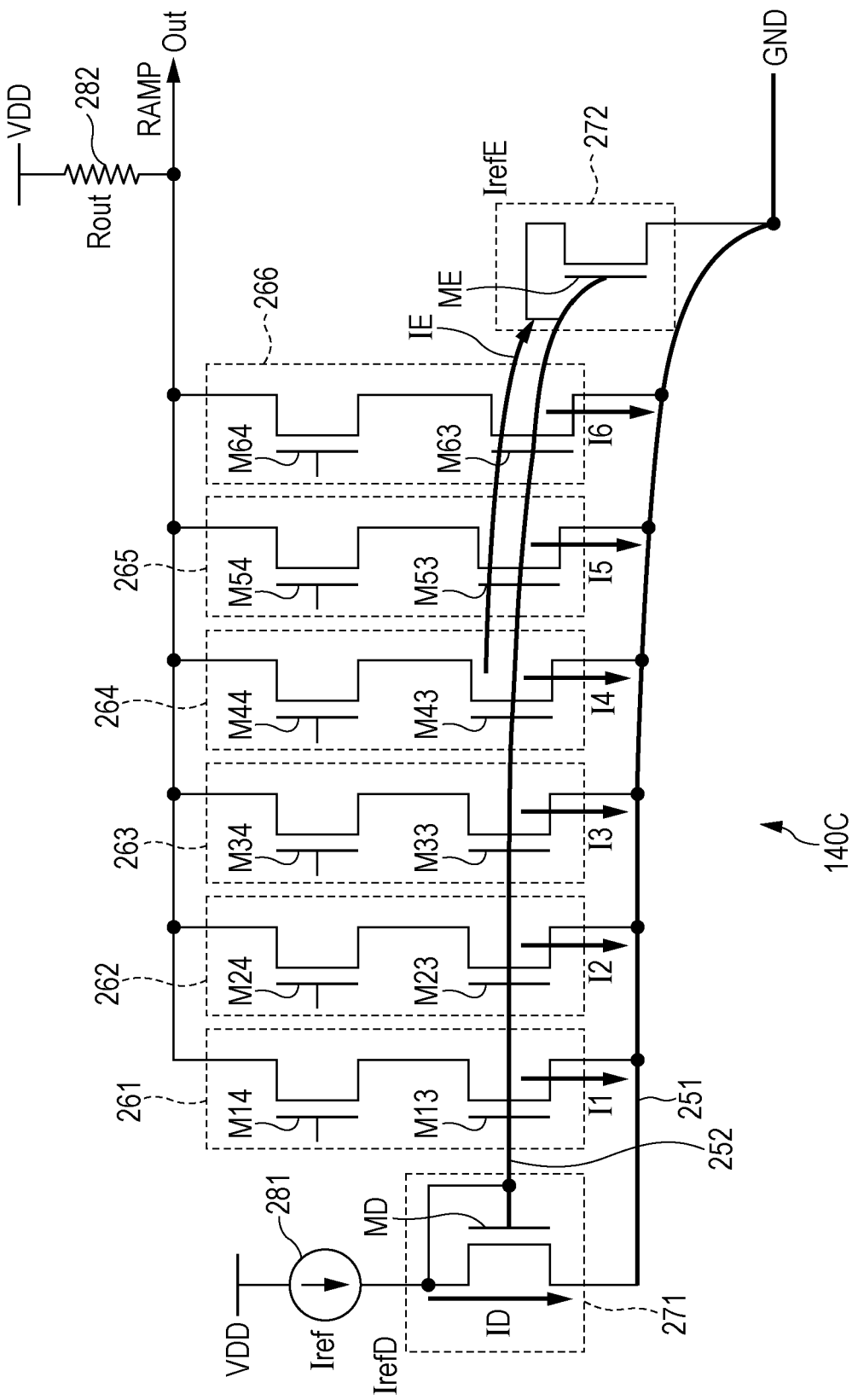
FIG. 10 is a circuit diagram illustrating a detailed configuration (third configuration) of a reference signal generation section.

FIG. 10 is a diagram illustrating a still another configuration of the reference signal generation section 140 in FIG. 2. That is to say, the examples of using a PMOS transistor as a transistor included in the current mirror circuit are illustrated in the above-described reference signal generation section 140A (FIG. 3) and the reference signal generation section 140B (FIG. 9). However, an NMOS transistor may be used in place of a PMOS transistor. In the reference signal generation section 140C in FIG. 10, an NMOS transistor is used as a transistor included in the current mirror circuit.

As illustrated in FIG. 10, the reference signal generation section 140C includes a first current source 261 to a sixth current source 266, a first bias block 271, a second bias block 272, a referenced current source 281, and an output resistor 282.

The first current source 261 includes an NMOS transistor M13, and an NMOS transistor M14. The gate terminal of the NMOS transistor M13 is connected to the bias line 252 thereof, and the source terminal thereof is connected to the power source line 251, and the drain terminal thereof is connected to the source terminal of the NMOS transistor M14.

The gate terminal of the NMOS transistor M14 is connected to a supply terminal (not illustrated in the figure) of a first switching control signal SW1 supplied from the system control section 115. That is to say, the NMOS transistor M14 is subjected to on/off control in accordance with the inverted signal of the first switching control signal SW1. Also, the source terminal of the NMOS transistor M14 is connected to the drain terminal of the NMOS transistor M13, and the drain terminal thereof is connected to an output terminal (Out) of the reference signal RAMP and one of the terminals of the output resistor 282 (resistance value Rout).

A second current source 262 is connected in parallel with the other current sources, such as the first current source 261, and so on, and includes an NMOS transistor M23 as a current source, and an NMOS transistor M24 as a switching element. Also, the NMOS transistors M23 and M24 have a same connection relationship as that of the NMOS transistors M13 and M14.

A third current source 263 to a sixth current source 266 are connected in parallel with the other current sources, such as the first current source 261, and so on. NMOS transistors included in those current sources, respectively, have a same connection relationship as that of the NMOS transistor included in the first current source 261.

The first bias block 271 includes an NMOS transistor MD. The gate terminal of the NMOS transistor MD is connected to the bias line 252, and the source terminal of the NMOS transistor MD is connected to the power source line 251. Also, the gate terminal of the NMOS transistor MD is connected to the drain terminal of itself (diode-connected). Further, the drain terminal of the NMOS transistor MD is connected to the referenced current source 281.

The second bias block 272 includes an NMOS transistor ME. The gate terminal of the NMOS transistor ME is connected to the bias line 252, and the source terminal of the NMOS transistor ME is connected to the power source line 251. Also, the gate terminal of the NMOS transistor ME is connected to the drain terminal of itself (diode-connected).

The current-inflow side terminal of the referenced current source 281 is connected to the power source VDD, and the current-outflow side terminal is connected to the drain terminal of the NMOS transistor MD.

The drain terminals of the PMOS transistors NMOS transistors M14, M24, M34, M44, M54, and M64 are connected to the output terminal (Out) of the reference signal RAMP, and one terminal of the output resistor 282 (resistance value Rout). In this regard, the other terminal of the output resistor 282 is connected to the power source VDD.

In the reference signal generation section 140C configured as described above, a current mirror circuit is configured between the NMOS transistor MD and the NMOS transistor ME, and the NMOS transistor M13, the NMOS transistor M23, the NMOS transistor M33, the NMOS transistor M43, the NMOS transistor M53, and the NMOS transistor M63.

Also, each of the current sources is subjected to on/off control in accordance with the corresponding switch control signal (SW1 to SW6). That is to say, when the first current source 261 to the sixth current source 262 are individually in the on-state, a current I1 to a current I6 flow through the individual NMOS transistors included in those current sources, respectively. Also, a bias current ID flows through the NMOS transistor MD of the first bias block 271. Further, a bias current IE flows through the NMOS transistor ME of the second bias block 272.

At this time, the bias current ID flows through the first bias block 271, and thereby the reference current IrefD is obtained. On the other hand, the bias current IE flows through the second bias block 272, and thereby the reference current IrefE is obtained.

That is to say, in the reference signal generation section 140C, two bias blocks, namely the first bias block 271 and the second bias block 272, are disposed so that the reference current Iref to be a reference of the current source is divided into two currents, the reference current IrefD and the reference current IrefE in order for the current flow through the bias line 252.

And in the reference signal generation section 140C, the reference current Iref is divided into the reference current IrefD and the reference current IrefE. And the divided reference current IrefE flows through the bias line 252 so that an IR drop also occurs on the bias line 252. Thereby, it becomes unnecessary to strengthen the bias line 252, and thus it is possible to reduce the influence of the IR drop without increasing the circuit size as a result.

Operation of reference signal generation section (DAC)

Next, a description will be given of operation of the reference signal generation section 140C. First, if all the current sources become the off-state, the reference signal RAMP of a maximum voltage level (power source VDD level) is output.

Next, further, after a lapse of a predetermined time period, the first current source is changed to the on-state. Thereby, in the first current source 261, a current flows from the NMOS transistor M14 to the NMOS transistor M13, and the voltage level of the reference signal RAMP output from the reference signal generation section 140C decreases.

Next, further, after a lapse of a predetermined time period, the second current source 262 is changed to the on-state while keeping the first current source 261 in the on-state. As a result, the amount of current that flows to the output terminal (Out) of the reference signal RAMP decreases, and the voltage level of the reference signal RAMP further decreases. After that, after a lapse of a predetermined time period, the third current source 263 to the sixth current source 266 are changed to the on-state in sequence so that the output voltage level of the reference signal RAMP linearly decreases with the lapse of time.

In this manner, in the reference signal generation section 140C, the reference signal RAMP, which increases in time with a predetermined slope and which has a voltage level waveform that increases with a predetermined dynamic range, is generated and output.

Also, in the reference signal generation section 140C, the current value of each current source is uniformized without being influenced by an IR drop, and thus the waveform of the reference signal RAMP is not curved, thereby it is possible to ensure the linearity of the voltage level of the reference signal RAMP in time.

As described above, in the case where an NMOS transistor is used, the reference signal generation section 140 operates as a power source reference DAC, and thus when a current does not flow through the current source, the output voltage level of the reference signal RAMP becomes the power source VDD. And the larger the number of the current sources through which a current flow, the lower the output voltage level linearly becomes.

Accordingly, if a power source VDD is stable, it is preferable to employ a configuration using an NMOS transistor. The reason for this is that, in general, a black color has a smaller S/N ratio (Signal Noise Ratio) compared with a white color, and thus is susceptible to the influence of noise. And a state in which a current is not flowing is difficult to be influenced by noise. Thus, noise of the reference signal RAMP becomes noticeable when a black level is high at earlier time. However, if operated as a power source reference DAC, the amount of current flowing at first is small, and thus it is possible to suppress the influence of noise.

For example, in professional electronic systems, it is possible to obtain a stable power source VDD supplied from the outside, and thus the present configuration is suitable when employed in the case where the CMOS image sensor 100 is mounted on a professional electronic system.

Another configuration (fourth configuration) of reference signal generation section (DAC)

Incidentally, the above-described simulation result illustrated in FIG. 5 indicates an IR drop of the power source line 201 in the case where all the current sources are in the on-state. In the process of generating the reference signal RAMP, each of the current sources is changed to the on-state in sequence, and thus an IR drop occurs on the power source line 201 in a state in which not all the current sources become the on-state.

For example, in the reference signal generation section 140A in FIG. 3, in the case where all of the first current source 211 to the sixth current source 216 become the off-state, currents do not flow through the PMOS transistors M11 to M61, and thus only the reference current IrefB of the second bias block 222 causes an IR drop of the power source line 201. In this case, it is difficult to balance the IR drops by only causing the IR drop to occur on the bias line 202, and thus for example, a configuration illustrated in FIG. 11 is employed.

Figure 11:
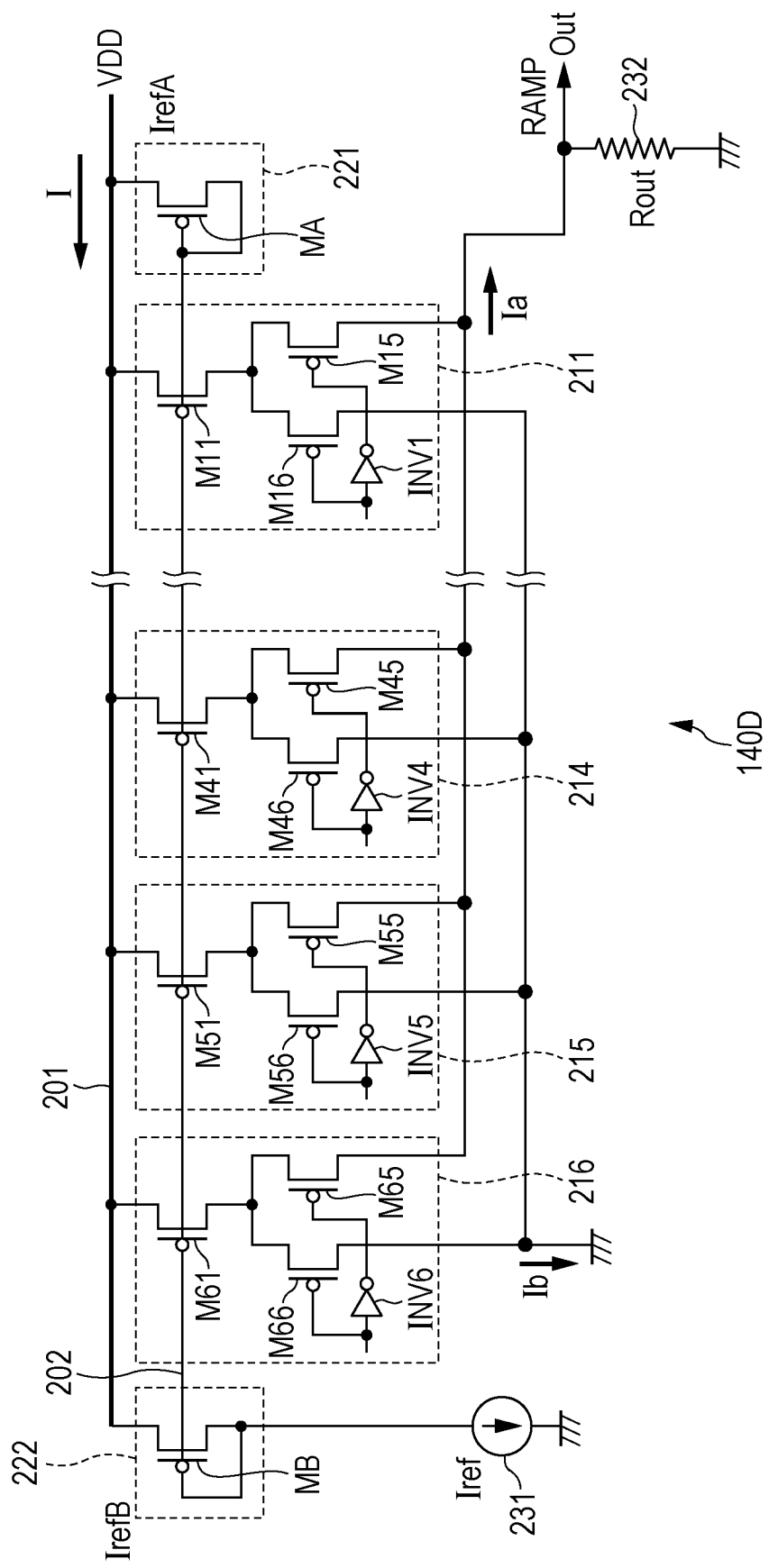
FIG. 11 is a circuit diagram illustrating a detailed configuration (fourth configuration) of a reference signal generation section.

FIG. 11 is a diagram illustrating a still another configuration of the reference signal generation section 140 in FIG. 2. That is to say, in the reference signal generation section 140D in FIG. 11, tow PMOS transistors are connected in parallel as a switching element disposed in each current source. Of the switching control signals supplied to the gate terminals of those PMOS transistors, one of the switching control signals is inverted by an inverter.

Specifically, the first current source 211 includes a PMOS transistor M11, a PMOS transistor M15, a PMOS transistor M16, and an inverter INV1. The gate terminal of the PMOS transistor M11 is connected to the bias line 202, the source terminal thereof is connected to the power source line 201, and the drain terminal thereof is connected to the source terminals of the PMOS transistor M15 and the PMOS transistor M16.

The gate terminal of the PMOS transistor M15 is connected to the output terminal of the inverter INV1. Also, the source terminal of the PMOS transistor M15 is connected to the drain terminal of the PMOS transistor M11, and the drain terminal thereof is connected to the output terminal (Out) of the reference signal RAMP and one terminal of the output resistor 232 (resistance value Rout).

The input terminal of the inverter INV1 is connected to the supply terminal (not illustrated in the figure) of the first switching control signal SW1 supplied from the system control section 115, and the output terminal thereof is connected to the gate terminal of the PMOS transistor M15.

The gate terminal of the PMOS transistor M16 is connected to the supply terminal (not illustrated in the figure) of the first switching control signal SW1 which is supplied from the system control section 115. Also, the source terminal of the PMOS transistor M16 is connected to the drain terminal of the PMOS transistor M11, and the drain terminal thereof is connected to ground.

That is to say, the gate terminal of the PMOS transistor M15 is supplied with the inverted first switching control signal SW1, and the gate terminal of the PMOS transistor M16 is supplied with the first switching control signal SW1, and thus the PMOS transistor M15 and the PMOS transistor M16 are in the opposite on/off-state. Accordingly, when the first current source 211 is in the on-state, that is to say, the PMOS transistor M15 is in the on-state, and the PMOS transistor M16 is in the off-state, the current Ia flows through the output terminal (Out) side. On the other hand, when the first current source 211 is in the off-state, that is to say, the PMOS transistor M15 is in the off-state, and the PMOS transistor M16 is in the on-state, the current Ib flows to ground side.

In the same manner, when the second current source 212 to the sixth current source 216 are individually in the on-state, the current Ia flows to the output terminal (Out) side. Also, when the second current source 212 to the sixth current source 216 are individually in the off-state, the current Ib flows to the ground side.

In this manner, when the first current source 211 to the sixth current source 216 are in the off-state, the current Ia does not flow to the output terminal (Out) side, but currents continue to flow through the first current source 211 to the sixth current source 216, and thus a so-called dump current Ib flows to the ground side. Thereby, even if each of the current sources is changed to the on-state in sequence in the process of generating the reference signal RAMP, the amount of current that flows through the power source line 201 becomes constant, and thus an IR drop occurs on the bias line 202 so that it is possible to balance the IR drops of the power source line 201 and the bias line 202.

Variations

In the above, the description has been given that the reference signal generation section 140 is a part of the column processing section 113. However, the reference signal generation section 140 may be configured as an independent block from the column processing section 113. Also, the description has been given that the reference signal generation section 140 is configured as one processing section of the column processing section 113. However, the reference signal generation section 140 may be considered as an independent device, and may be configured as a reference signal generation device (DA conversion circuit (DAC: Digital Analog Converter)).

Further, in the above, the description has been given that the column processing section 113 is configured as one processing section of the CMOS image sensor 100. However, the column processing section 113 may be considered as an independent device having a function of AD conversion, and may be configured to be an AD converter. In this case, the function of the sense amplifier 119 will be included in the column processing section 113.

In this regard, the present technique is not limited to application to the reference signal generation section (DAC) 140. That is to say, it is possible to apply the present technique to a semiconductor integrated circuit, in general, which includes a current mirror circuit.

Also, the present technique is not limited to be applied to a solid-state imaging device. That is to say, it is possible to apply the present technique to an electronic system in general using a solid-state imaging device for an image capturing section (photoelectric conversion section), such as an imaging apparatus, for example, a digital still camera, a video camera, and so on, a mobile terminal apparatus having an imaging function, a copy machine using a solid-state imaging device for an image read section, and so on. The solid-state imaging device may be formed as one chip, or may be formed in a module with an imaging function, in which an imaging section and a signal processing section or an optical system are packaged together.

Figure 12:
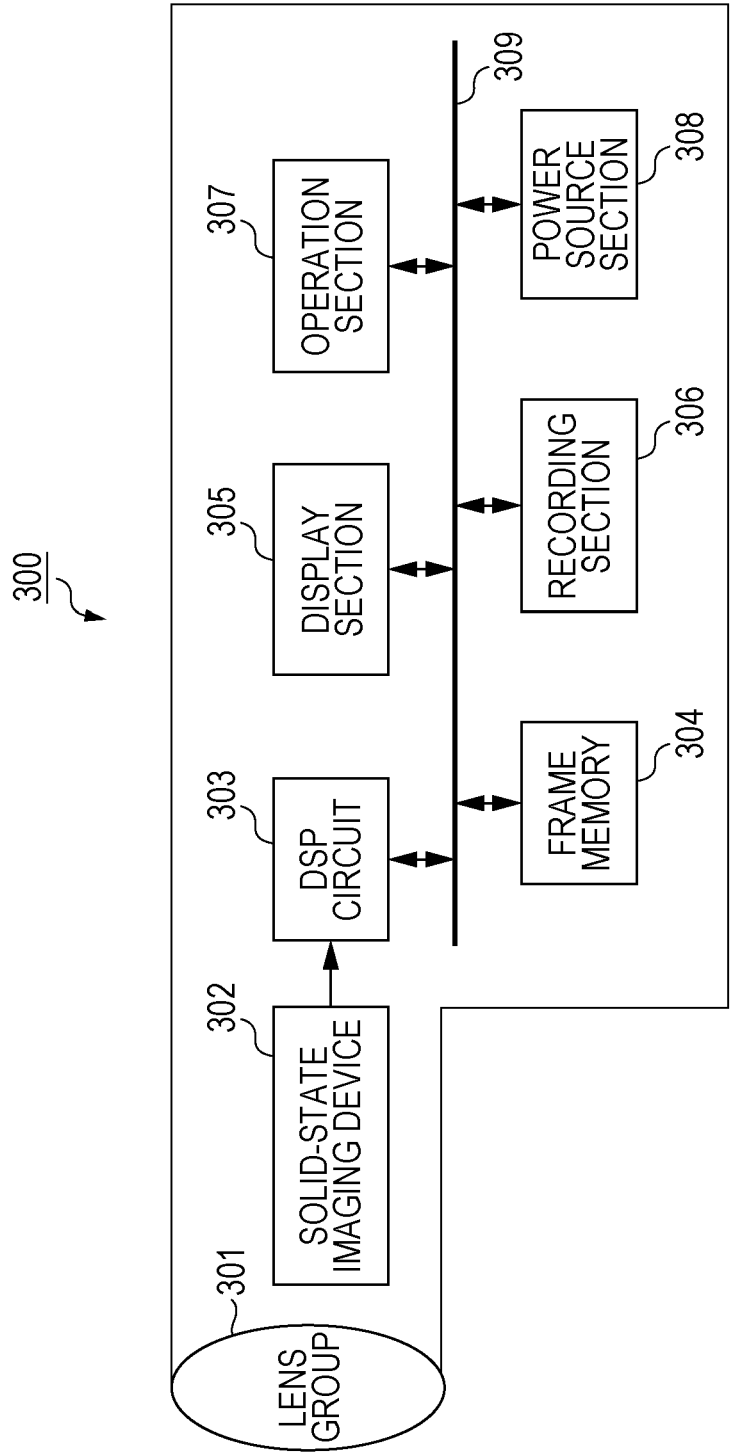
FIG. 12 is a block diagram illustrating an example of a configuration of an imaging apparatus.

Example of configuration of electronic system to which the present technique is applied FIG. 12 is a block diagram illustrating an example of a configuration of an imaging apparatus as an electronic system to which the present technique is applied.

An imaging apparatus 300 in FIG. 12 includes an optical section 301 including a lens group, and so on, a solid-state imaging device (imaging device) 302 to which each configuration of the unit pixel 130 described above is employed, and a DSP (Digital Signal Processor) circuit 303, which is a camera signal processing circuit. Also, the imaging apparatus 300 includes a frame memory 304, a display section 305, a recording section 306, an operation section 307, and a power source section 308. The DSP circuit 303, the frame memory 304, the display section 305, the recording section 306, the operation section 307, and the power source section 308 are mutually connected through a bus line 309.

The optical section 301 captures incident light (image light) from a subject, and forms an image on an imaging surface of the solid-state imaging device 302. The solid-state imaging device 302 converts the amount of the incident light formed on the imaging surface by the optical section 301 into an electronic signal, and outputs the electronic signal as a pixel signal. For the solid-state imaging device 302, it is possible to use the solid-state imaging device, such as a CMOS image sensor 100 according to the above-described embodiment, and so on, that is to say, a solid-state imaging device capable of achieving image capture without distortion by global exposure.

The display section 305 includes a panel-type display device, such as a liquid crystal panel, an organic EL (Electro Luminescence) panel, and so on, for example, and displays a moving image or a still image captured by the solid-state imaging device 302. The recording section 306 records the moving image or the still image captured by the solid-state imaging device 302 onto the recording medium.

The operation section 307 issues operation commands on various functions of the imaging apparatus 300 by operation of a user. The power source section 308 suitably supplies various power sources, which become operation power sources, to the DSP circuit 303, the frame memory 304, the display section 305, the recording section 306, and the operation section 307.

In the above-described embodiment, the description has been given of the case where the present technique is applied to a CMOS image sensor in which unit pixels 130 that detect signal charges in accordance with the amount of visible light as physical quantities are disposed in a matrix as an example. However, the present technique is not limited to be applied to a CMOS image sensor. It is possible to generally apply the present technique to a solid-state imaging device of a column type, in which a column processing section is disposed for each pixel column of a pixel array section.

Also, The present disclosure is not limited to be applied to a solid-state imaging device that detects distribution of an amount of visible incident light in order to capture an image. The present disclosure can be applied to a solid-state imaging device that captures distribution of an amount of incidence, such as infrared rays, or X-rays, or particles, or the like. The present disclosure can also be applied to, in a broad sense, a solid-state imaging device (physical-quantity distribution detection apparatus) in general, such as a fingerprint detection sensor, that detects distribution of the other physical quantities, for example, pressure, electrostatic capacitance, etc., to capture an image.

In this regard, an embodiment of the present technique is not limited to the above-described embodiments, and various variations are possible without departing from the gist of the present technique.

Also, it is possible to configure the present technique as follows.

(1) A semiconductor integrated circuit including:
a plurality of current sources including a first transistor individually connected to a power source line and a bias line; and
a plurality of bias blocks including a second transistor configured to constitute a current mirror circuit together with the first transistor, and to divide a reference current to be a reference of the current sources so that the reference current flows through the bias line.

(2) The semiconductor integrated circuit according to (1) wherein a number of the bias blocks disposed is two.

(3) The semiconductor integrated circuit according to (2) wherein a ratio of a reference current configured to flow through the bias line by one of the bias blocks to a reference current configured not to flow through the bias line by the other of the bias blocks is 1:3.

(4) The semiconductor integrated circuit according to any one of (1) to (3),
wherein the first transistor includes a PMOS transistor, and
a gate of the PMOS transistor is connected to the bias line, and a source thereof is connected to the power source line, and a drain thereof is connected to an output terminal.

(5) The semiconductor integrated circuit according to any one of (1) to (3),
wherein the first transistor includes an NMOS transistor, and
a gate of the NMOS transistor is connected to the bias line, and a source thereof is connected to the power source line, and a drain thereof is connected to an output terminal.

(6) The semiconductor integrated circuit according to any one of (1) to (5),
wherein the semiconductor integrated circuit is a DA (Digital Analog) conversion circuit configured to convert a digital signal into an analog signal, and
the current source further includes a switching element connected to the first transistor in series, and configured to perform switching operation in accordance with a digital control signal so that a current from the first transistor flows to an output terminal.

(7) A method of controlling a current of a semiconductor integrated circuit including a plurality of current sources including a first transistor individually connected to a power source line and a bias line, and a plurality of bias blocks including a second transistor configured to constitute a current mirror circuit together with the first transistor, and to cause a reference current to be a reference of the current sources to flow, the method including:
the plurality of bias blocks dividing the reference current into a plurality of currents, and causing the currents to flow through the bias line.

(8) An AD converter including:
a DA conversion section including
a plurality of current sources including a first transistor individually connected to a power source line and a bias line; and a plurality of bias blocks including a switching element connected to the first transistor in series and configured to perform switching operation in accordance with a digital control signal so that a current from the first transistor flows to an output terminal, and
a plurality of bias blocks including a second transistor configured to constitute a current mirror circuit together with the first transistor, and to divide a reference current to be a reference of the current sources into a plurality of currents so that the reference current flows through the bias line; and
an AD (Analog Digital) conversion section configured to convert an analog signal to a digital signal on the basis of a reference signal generated by the DA conversion section.

(9) A solid-state imaging device including:
a pixel array section including a plurality of unit pixels disposed in a two-dimensional state; and
an AD conversion section configured to convert an analog pixel signal read from the plurality of unit pixels to a digital signal,
wherein the AD conversion section includes a DA conversion section including
a plurality of current sources including a first transistor individually connected to a power source line and a bias line, and a plurality of bias blocks including a switching element connected to the first transistor in series and configured to perform switching operation in accordance with a digital control signal so that a current from the first transistor flows to an output terminal, and
a plurality of bias blocks including a second transistor configured to constitute a current mirror circuit together with the first transistor, and to divide a reference current to be a reference of the current sources into a plurality of currents so that
the reference current flows through the bias line, and the AD conversion section is configured to convert an analog pixel signal to a digital signal on the basis of a reference signal generated by the DA conversion section.

(10) An electronic system including a solid-state imaging device including:
the solid-state imaging device including
a pixel array section including a plurality of unit pixels disposed in a two-dimensional state; and
an AD conversion section configured to convert an analog pixel signal read from the plurality of unit pixels,
wherein the AD conversion section includes a DA conversion section including
a plurality of current sources including a first transistor individually connected to a power source line and a bias line, and a plurality of bias blocks including a switching element connected to the first transistor in series and configured to perform switching operation in accordance with a digital control signal so that a current from the first transistor flows to an output terminal, and
a plurality of bias blocks including a second transistor configured to constitute a current mirror circuit together with the first transistor, and to divide a reference current to be a reference of the current sources into a plurality of currents so that the reference current flows through the bias line, and
the AD conversion section is configured to convert an analog pixel signal to a digital signal on the basis of a reference signal generated by the DA conversion section.

What is claimed is:
1. A solid-state imaging device including a semiconductor integrated circuit comprising:
the semiconductor integrated circuit comprising:
a first current source transistor between a first bias block transistor and a second bias block transistor, a gate terminal of the first bias block transistor being electrically connected to a gate terminal of the first current source transistor; and a bias line electrically connected to a drain terminal of the first bias block transistor and to the gate terminal of the first bias block transistor, a gate terminal of the second bias block transistor being electrically connected to a drain terminal of the second bias block transistor and to the bias line;

an analog-to-digital conversion section configured to convert an analog signal to a digital signal on the basis of a reference signal generated by the semiconductor integrated circuit; and a pixel array section that converts incident light into the analog signal, wherein the first bias block transistor and the second bias block transistor are disposed in a manner that a reference current to be a reference of the first current source transistor is divided into two sub reference currents and one of the two sub reference currents flows through the bias line.

2. The solid-state imaging device according to claim 1, wherein the first current source transistor, the first bias block transistor, and the second bias block transistor are PMOS transistors.

3. The solid-state imaging device according to claim 1, wherein the first current source transistor, the first bias block transistor, and the second bias block transistor are NMOS transistors.

4. The solid-state imaging device according to claim 1, further comprising:
a voltage line electrically connected to a source terminal of the first current source transistor, to a source terminal of the first bias block transistor and to a source terminal of the second bias block transistor.

5. The solid-state imaging device according to claim 4, wherein the voltage line is a power source line.

6. The solid-state imaging device according to claim 4, wherein the voltage line is a ground line.

7. The solid-state imaging device according to claim 1, further comprising:

a third bias block transistor between the first bias block transistor and the second bias block transistor.

8. The solid-state imaging device according to claim 7, wherein the bias line is electrically connected to a gate terminal of the third bias block transistor and to a drain terminal of the third bias block transistor.

9. The solid-state imaging device according to claim 1, further comprising:
a second current source transistor between the first current source transistor and the second bias block transistor.

10. The solid-state imaging device according to claim 9, wherein a gate terminal of the first current source transistor is electrically connected to a gate terminal of the second current source transistor.

11. The solid-state imaging device according to claim 1, wherein a drain terminal of the first current source transistor is electrically connected to a source terminal of a first switching element.

12. The solid-state imaging device according to claim 11, wherein a drain terminal of the first switching element is electrically connected to a drain terminal of a second switching element.

13. The solid-state imaging device according to claim 12, wherein a source terminal of the second switching element is electrically connected to a drain terminal of a second current source transistor.

14. The solid-state imaging device according to claim 11, wherein an input terminal of an inverter is electrically connected to a gate terminal of a complementary switching element.

15. The solid-state imaging device according to claim 14, wherein a source terminal of the complementary switching element is electrically connected to the source terminal of the first switching element.

16. The solid-state imaging device according to claim 1 further comprising:
an optical section that captures the incident light and forms an image on an imaging surface of the solid-state imaging device.

* * * * *